United States Patent [19]
Roselle et al.

[11] 3,965,410
[45] June 22, 1976

[54] A.C. POTENTIOMETER WITH BRIDGE HAVING VOLTAGE CONTROLLABLE DEVICES

[75] Inventors: Pierce C. Roselle; Roy A. Zaborowski, both of Phoenix, Ariz.

[73] Assignee: Sperry Rand Corporation, New York, N.Y.

[22] Filed: Aug. 11, 1975

[21] Appl. No.: 603,423

[52] U.S. Cl.................................. 323/19; 307/251; 323/75 E
[51] Int. Cl.² ........................................ G05F 1/56
[58] Field of Search ................ 307/1, 2, 43, 72, 75, 307/251, 304; 323/16, 19, 75 R, 75 E, 75 N; 340/210; 318/135

[56] References Cited
UNITED STATES PATENTS
3,435,375  3/1969  Miller, Jr. ...................... 323/75 E X Primary Examiner—Gerald Goldberg
Attorney, Agent, or Firm—Howard P. Terry; Seymour Levine

[57] ABSTRACT

An a.c. potentiometer wherein the gain of a variable gain circuit is controlled by a d.c. reference signal and a d.c. input signal, the gain being adjusted to be proportional to the ratio of the d.c. input signal to the d.c. reference signal. An a.c. reference is added to the d.c. reference. Since the gain of the circuit is equal for both a.c. and d.c. input voltages, the a.c. signal at the circuit a.c. output terminals is proportional to the a.c. reference signal and the ratio of the d.c. input signal to the d.c. reference signal which defines the gain. Desired electrical isolation of the a.c. circuitry from the d.c. circuitry is achieved by means of input and output coupling transformers for the a.c. signals.

9 Claims, 1 Drawing Figure

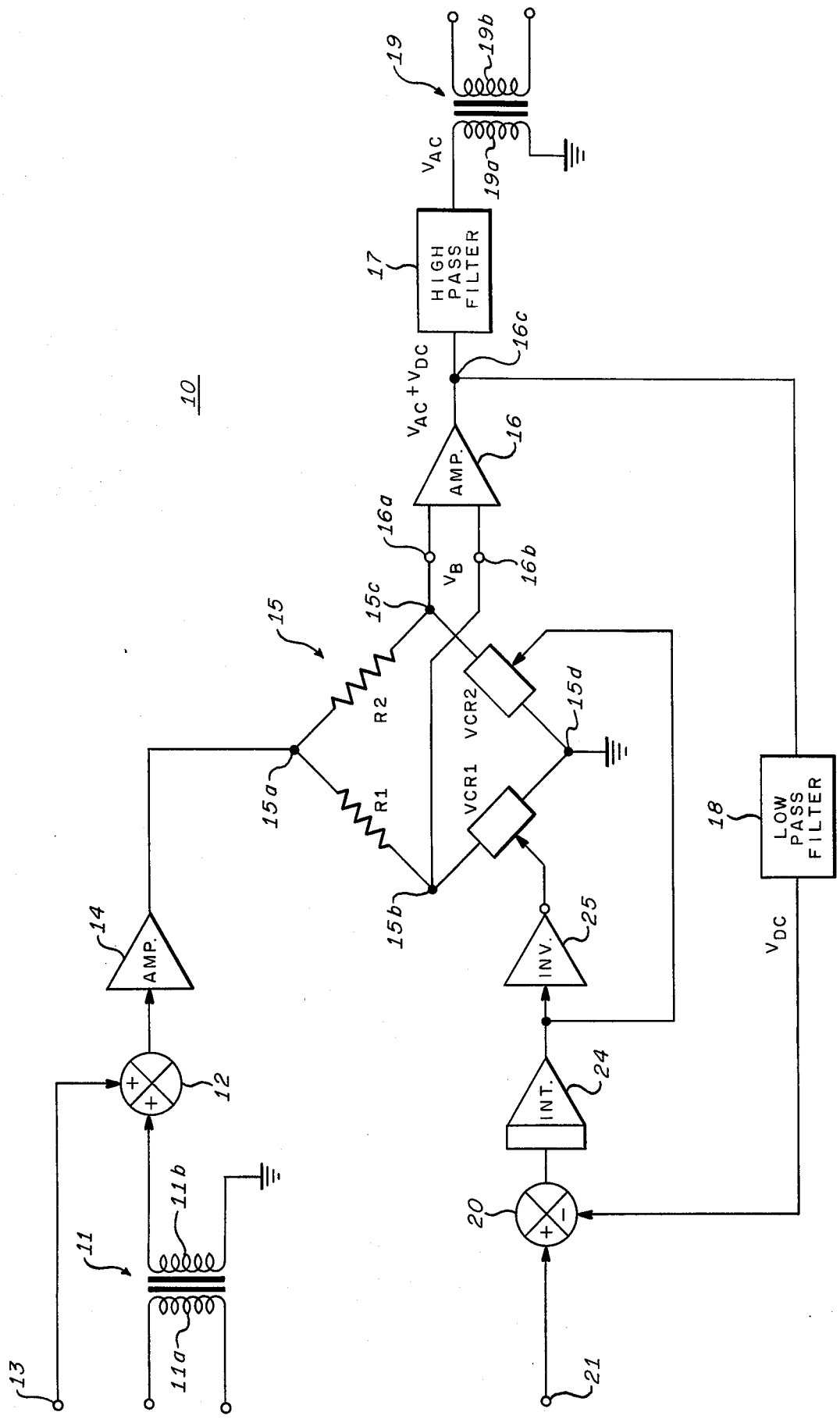

A.C. POTENTIOMETER WITH BRIDGE HAVING VOLTAGE CONTROLLABLE DEVICES

BACKGROUND OF THE INVENTION

1. Field of the Invention

The subject invention pertains to the field of a.c. potentiometers and more particularly to a.c. potentiometers wherein the ratio of the a.c. output signal to the a.c. input signal is directly proportional to the ratio of two d.c. signals.

2. Description of the Prior Art

In many applications, electrical data is supplied from reference instruments as a d.c. signal referenced to an independent or dependent d.c. source while, in many instances, an independant user of the reference data requires an a.c. signal reference to an independent a.c. source. For example, an air data computer may provide an altitude error output signal in the form of a d.c. signal referenced to an aircraft d.c. bus to a user equipment, such as an autopilot or flight director, that requires the altitude error signal as an independent a.c. signal. Prior art provided a motor generator in the air data computer or in the autopilot which was responsive to the d.c. error signal and provided an analog type output in the form of a mechanical shaft angle displacement. The shaft drove the wiper arm of a potentiometer, to which a reference a.c. voltage was applied from by the user equipment. The output voltage produced at the wiper arm was related to the reference voltage in accordance with the ratio of that portion of the resistance between the wiper arm and one end of the resistive element and the total resistance of the resistive element. This technology enables the electrical circuits in the user system to be completely isolated from the electrical circuits contained in the sensor or generator system. However, it is not only expensive, relatively unreliable and bulky, but also is inaccurate due to the hysteresis caused by the inherent backlash in the mechanism. Previous attempts to replace the mechanical elements with electronic elements have resulted in systems such as those that employ electronic IC multipliers, which do not provide sufficient accuracy, and simple modulators, which provide a.c. output signals that are only proportional to the d.c. data signal and not to the d.c. data signal and the a.c. reference or excitation signal.

The present invention provides an isolated a.c. output signal that closely resembles the output signal of a potentiometer, which is proportional in amplitude to both an a.c. excitation signal and a d.c. data signal.

SUMMARY OF THE INVENTION

An a.c. potentiometer embodying the principles of the present invention comprises a bridge circuit to which both a user supplied a.c. excitation and a sender supplied d.c. excitation are applied. The bridge unbalance voltage is routed through a lowpass filter whereby the d.c. voltage unbalance is fed to a subtraction network wherein it is subtracted from a d.c. input or data signal to obtain a d.c. error signal and through a high pass filter to an isolation transformer whereby the a.c. unbalance or output voltage appears at the output terminals of the transformer. The d.c. error signal so derived is applied to the input terminals of an integrator, the output of which is applied directly to one voltage controllable resistor contained in the bridge circuit and through an inverter, which changes the polarity of the d.c. error signal, to a second voltage controllable resistor in the bridge circuit. The output voltage of the integrator continues to change as long as an error voltage exists thus, continuously changing the bridge unbalance until an error signal null is achieved. When this occurs, the bridge d.c. unbalance voltage, which is proportional to the bridge gain, is directly proportional to the ratio of the d.c. input signal to the d.c. excitation. Since the bridge gain is equal for both the d.c. and a.c. voltages, the ratio of the a.c. output signal to the a.c. excitation signal, which defines the bridge a.c. gain, is directly proportional to the ratio of the d.c. input signal to the d.c. excitation signal.

BRIEF DESCRIPTION OF THE DRAWINGS

The FIGURE shown is a schematic diagram, partially in block form, of an embodiment of the invention.

DESCRIPTION OF THE PREFERRED EMBODIMENT

Referring to the FIGURE, a solid state a.c. potentiometer 10 includes an input transformer 11 having primary winding 11a and secondary winding 11b, with the terminals of the primary winding 11a serving as the input terminals for the a.c. reference or excitation voltage and the secondary winding 11b coupled to an adder network 12. A d.c. reference or excitation terminal 13 is also coupled to adder circuit 12, which in turn couples to amplifier 14, the output terminal of which is coupled to node 15a of bridge circuit 15. Bridge circuit 15 comprises resistor R1; resistor R2 one end of which forms node 15a with one end of resistor R1; voltage controllable resistor VCR1, one end of which couples to the other end of resistor R1 forming node 15b; resistor VCR2, one end of which couples to the other end of resistor R2 forming node 15c, and the other end which couples to the other end of the voltage controllable resistor VCR1, forming node 15d. The voltage controllable resistors VCR1 and VCR2 may comprise field effect transistors or be any other appropriate configuration. Nodes 15b and 15c, between which the output voltage $V_b$ of the bridge 15 exists, are coupled to terminals 16a, 16b, respectively, of amplifier 16, while the output terminal 16c of amplifier 16 is coupled to a high pass filter 17 and to a lowpass filter 18. The output terminal of the high pass filter 17 is coupled to the primary winding 19a of isolation transformer 19, the secondary winding 19b of which provides the a.c. output. The output terminal of the lowpass filter 18 couples to a subtraction network 20, to which a d.c. input terminal 21 also is coupled, while the output terminal of the subtraction network 20 is coupled to the input terminal of an integrator 24, the output of which is coupled to an inverter 25 and to a voltage controllable resistor VCR2 while the inverter 25 is coupled to voltage controllable resistor VCR1.

An a.c. excitation, which may be supplied by the user, is applied to the input terminals of the primary winding 11a of transformer 11 and coupled to adder network 12 via the secondary winding 11b, while a d.c. excitation voltage is also coupled to adder network 12 via terminal 13. This coupling arrangement electrically isolates the a.c. excitation from the sender circuitry, which provides the d.c. excitation. The sum of the d.c. excitation and the a.c. excitation is coupled from the adder network 12 to node 15a of bridge 15 via amplifier 14. With the sum of the a.c. and d.c. excitation applied to node 15a, a bridge unbalance voltage appears between nodes 15b and 15c. This voltage is applied across terminals 16a and 16b of amplifier 16 wherein the amplified unbalance voltage, which contains both d.c. and a.c. components is coupled from the output terminal 16c to lowpass filter 18 whereby, the a.c. component undergoes an appreciable attenuation and a voltage, that is essentially d.c., is coupled from the output of the lowpass filter to the subtraction network 20, wherein it is subtracted from a d.c. input signal coupled from terminal 21. The difference between the d.c. input voltage and the d.c. voltage coupled from the lowpass filter 18 constitutes an error signal which is coupled from the subtraction network 20 to the integrator 24. An output voltage from the integrator 24 is coupled to the voltage controllable resistor VCR2 and to the inverter 25 which couples a d.c. voltage that is of the opposite polarity from that of the output voltage of the integrator 24, to voltage controllable resistor VCR1 whereby, the resistance values of VCR1 and VCR2 change in opposite directions as a result of having equal d.c. voltages with opposite polarities applied thereto. The output voltage of integrator 24 continues to change until the error voltage, which constitutes the input voltage to the integrator 24, is driven to zero, thus causing the resistance values of VCR1 and VCR2 to change and alter the unbalance and gain of the bridge 15 until the d.c. voltage coupled from the output of the lowpass filter 18 to the subtraction network 20, equals the d.c. input voltage coupled from terminal 21 to the subtraction network 20, thereby establishing an error signal which is equal to zero. With an error signal equal to zero, the d.c. voltage across nodes 15b and 15c is directly proportional to the d.c. input voltage at terminal 21, thus establishing a bridge gain that is directly proportional to the ratio of the d.c. input voltage at terminal 21 to the d.c. excitation at terminal 13. Since the bridge 15 is comprised of resistive elements only, the d.c. and a.c. gains of the bridge 15 are identical.

The amplified bridge unbalance voltage at node 16c, which contains both a.c. and d.c. components, is also coupled to high pass filter 17 wherein the d.c. component is removed and the amplified a.c. bridge unbalance voltage appears at the output terminal of high pass filter 17 from which it is coupled to the primary winding 19a of isolation transformer 19 and thereby coupled to the output terminals of the secondary winding 19b. Thus electrical isolation of the user circuitry, to which the secondary winding 19b is coupled, from the sender d.c. circuitry, which supplies the d.c. excitation and input signals, is provided by the isolation transformer 19. Since the bridge 15 gain is equal for both a.c. and d.c. excitation voltages and this gain is directly proportional to the ratio of the d.c. input voltage to the d.c. excitation voltage, the a.c. voltage appearing at the terminals of secondary winding 19b is directly proportional to the d.c. input voltage and the a.c. excitation.

While the invention has been described in its preferred embodiment, it is to be understood that the words which have been used are words of description rather than limitation and that changes may be made within the purview of the appended claims without departing from the true scope and spirit of the invention in its broader aspects.

We claim:

1. An a.c. potentiometer for providing a variable a.c. output voltage comprising:

means for providing a variable d.c. voltage;

means for providing an a.c. reference excitation;

means for providing a d.c. reference excitation;

a variable gain network including an input means, control means and an output means;

means for summing said a.c. and d.c. reference excitations and for supplying said summed excitations to said network input means whereby a signal at said network output means includes both a.c. and d.c. voltage components;

means, responsive to said d.c. voltage component of said signal at said network output means and to said variable d.c. voltage, for supplying a d.c. error signal, said d.c. error signal coupled to said network control means for controlling the gain of said variable gain network to reduce said error signal to zero whereupon the gain of said variable gain network is directly proportional to said variable d.c. voltage whereby said a.c. component at said network output means is likewise directly proportional to said variable d.c. voltage; and means, responsive to said signal at said network output means, for removing said d.c. component therefrom, thereby providing said variable a.c. output voltage.

2. An a.c. potentiometer as recited in claim 1 in which said variable gain network comprises:

a four node electrical network (a, b, c, d) including a first resistor connected between network nodes (a) and (b), a second resistor connected between network nodes (a) and (c), a first voltage controllable resistor connected between nodes (b) and (d) and having a d.c. voltage input terminal, a second voltage controllable resistor connected between nodes (c) and (d) and having a d.c. voltage input terminal, said d.c. voltage input terminals coupled to said d.c. error signal means and said node (a) coupled to said summing means; and output means, connected across nodes (b) and (c) of said four node network, for coupling the voltage therebetween to said d.c. component removal means and to said d.c. error signal means.

3. An a.c. potentiometer as recited in claim 2 wherein said variable gain network further includes an inverter coupled to said d.c. error signal means and to said d.c. voltage input terminal of said first voltage controllable resistor whereby, the voltage applied to said first voltage controllable resistor is of a polarity opposite to the polarity of said d.c. voltage at said output terminal of said subtraction network.

4. An a.c. potentiometer as recited in claim 3 wherein said d.c. error signal means comprises:

a lowpass filter coupled to said output means of said variable gain network;

means, coupled to said lowpass filter and to said variable d.c. voltage means, for obtaining a voltage representative of the voltage difference between said variable d.c. voltage and said d.c. component of said signal at said output means of said variable gain network; and integrator means including an input means and an output means coupled to said voltage difference means at said input means and to said inverter and to said d.c. voltage input terminal of said second voltage controllable resistor at said output means for providing a voltage proportional to the integrated value of said d.c. error signal.

5. An a.c. potentiometer as recited in claim 4 wherein said d.c. component removal means comprises:
  a high pass filter coupled to said output means of said variable gain network; and
  a transformer including a primary and a secondary, said primary coupled to said high pass filter and said secondary providing said variable a.c. output voltage thereby electrically isolating said a.c. output voltage from said d.c. reference excitation and said variable d.c. voltage.

6. An a.c. potentiometer as recited in claim 4 wherein said variable gain network further includes an amplifier, having an input means and an output means, said output means coupled to said node ($a$) of said four node electrical network and said input means coupled to said summing means whereby, the sum of said a.c. and d.c. excitations are scaled prior to coupling to node ($a$) of said four node electrical network.

7. An a.c. potentiometer as recited in claim 4 wherein said first and second voltage controllable resistors each include field effect transistors.

8. An a.c. potentiometer as recited in claim 4 wherein said output means connected across nodes ($b$) and ($c$) of said four node network is an amplifier whereby, the voltage between said nodes ($b$) and ($c$) is amplified prior to being coupled to said lowpass filter and to said d.c. component removal means.

9. An a.c. potentiometer as recited in claim 5 wherein said a.c. reference excitation means comprises a transformer having a primary and a secondary, said primary providing the input terminals for said a.c. reference excitation and said secondary coupled to said summing means, thereby electically isolating said a.c. reference excitation from said d.c. reference excitation and said variable d.c. voltage.

* * * * *